(12) United States Patent
Geng et al.

(10) Patent No.: US 12,525,933 B2
(45) Date of Patent: Jan. 13, 2026

(54) POWER AMPLIFIER AND DOHERTY AMPLIFIER COMPRISING THE SAME

(71) Applicant: Ampleon Netherlands B.V., Nijmegen (NL)

(72) Inventors: Zhi Geng, Nijmegen (NL); Yi Zhu, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 649 days.

(21) Appl. No.: 17/935,273

(22) Filed: Sep. 26, 2022

(65) Prior Publication Data

US 2023/0105193 A1 Apr. 6, 2023

(30) Foreign Application Priority Data

Oct. 4, 2021 (NL) ...................................... 2029316

(51) Int. Cl.
*H03F 3/68* (2006.01)
*H01L 23/66* (2006.01)
(Continued)

(52) U.S. Cl.
CPC ............. *H03F 3/245* (2013.01); *H01L 23/66* (2013.01); *H03F 1/0288* (2013.01); *H03F 1/565* (2013.01);
(Continued)

(58) Field of Classification Search
CPC ........ H03F 3/245; H03F 1/0288; H03F 1/565; H03F 3/195; H03F 2200/451; H03F 3/213; H03F 2200/222; H03F 2200/387; H03F 3/68; H03F 3/602; H03F 3/211; H01L 23/66; H01L 2223/6611; H01L 2223/6655; H01L 24/05; H01L 24/49;
(Continued)

(56) References Cited

U.S. PATENT DOCUMENTS 6,815,740 B2 11/2004 Nelson et al.
8,592,966 B2 * 11/2013 Wood .................... H01L 23/642
257/691

(Continued)

OTHER PUBLICATIONS

International-Type Search Report and Written Opinion, Application No. NL2029316, dated Jun. 3, 2022, 11 pages.

*Primary Examiner* — Khanh V Nguyen
(74) *Attorney, Agent, or Firm* — McDonnell Boehnen Hulbert & Berghoff LLP

(57) ABSTRACT

Example embodiments relate to power amplifiers and Doherty amplifiers that include the same. One example embodiment includes a power amplifier. The power amplifier includes one or more radiofrequency (RF) output terminals. The power amplifier also includes a Gallium Nitride (GaN) semiconductor die on which a power field-effect transistor (FET) is integrated. The FET includes a plurality of FET cells that are adjacently arranged in a row. The FET cells are connected either directly or indirectly to the one or more RF output terminals via a respective first inductor. For FET cells arranged at opposing ends of the row of FET cells, a total FET cell gate width and an inductance of the first inductor is larger and smaller than the total FET cell gate width and inductance of the first inductor for one or more FET cells arranged in the middle of the row of FET cells, respectively.

20 Claims, 4 Drawing Sheets

(51) Int. Cl.
  *H03F 1/02*   (2006.01)
  *H03F 1/56*   (2006.01)
  *H03F 3/195*  (2006.01)
  *H03F 3/24*   (2006.01)
  *H03F 3/21*   (2006.01)

(52) U.S. Cl.
  CPC ...... *H03F 3/195* (2013.01); *H01L 2223/6611* (2013.01); *H01L 2223/6655* (2013.01); *H03F 3/211* (2013.01); *H03F 2200/451* (2013.01)

(58) Field of Classification Search
  CPC ..... H01L 2223/6644; H01L 2223/6683; H01L 2224/04042; H01L 2224/49111; H01L 2224/49112; H01L 2224/49175
  USPC ............................................. 330/124 R, 295
  See application file for complete search history.

(56) References Cited

U.S. PATENT DOCUMENTS

| | | | |
|---|---|---|---|
| 10,211,170 B2* | 2/2019 | Peyrot | H03F 1/565 |
| 10,811,370 B2* | 10/2020 | Bothe | H01L 23/642 |
| 2021/0167741 A1 | 6/2021 | Harauchi et al. | |

* cited by examiner

POWER AMPLIFIER AND DOHERTY AMPLIFIER COMPRISING THE SAME

CROSS-REFERENCE TO RELATED APPLICATIONS

The present application is a non-provisional patent application claiming priority to Netherlands Patent Application No. NL 2029316, filed Oct. 4, 2021, the contents of which are hereby incorporated by reference.

FIELD OF THE DISCLOSURE

The present disclosure relates to a power amplifier and to a Doherty amplifier comprising the same. The present disclosure particularly relates to gallium nitride (GaN) power amplifiers operating at radiofrequency (RF) frequencies between 0.5 and 6 GHz, and at relatively high powers, e.g. in excess of 200 Watt.

BACKGROUND

A GaN based power amplifier is shown in FIG. 1. In FIG. 1, a packaged power amplifier 100 is shown in which a gallium nitride die 30 is mounted on a heat conducting substrate 15. On semiconductor die 30, a field-effect transistor (FET) is integrated, such as a high-electron mobility transistor (HEMT).

Packaged power amplifier 100 further comprises a pair of RF input leads 10A, 10B, and a pair of RF output leads 20A, 20B. Generally, the packaged power amplifier comprises more leads for inputting and outputting control signals, DC power, etc. but these are omitted for illustrative purposes. Furthermore, packaged power amplifier 100 is a leadframe based package. It may comprise a cover (not shown) in the form of a cover or lid. Alternatively, the lid or cover is formed using a solidified molding compound which may or may not cover dies 30, 40, 50.

In addition to semiconductor die 30, packaged power amplifier 100 also comprises an input semiconductor die 40 and an output semiconductor die 50. On these dies, one or more capacitors are integrated. Dies 40, 50 may for example be silicon or gallium arsenide based. Alternatively, non-semiconductor materials may be used.

The FET on GaN die 30 comprises a plurality of FET cells U1, U4, U5, U8 that are adjacently arranged in a row. An example of a FET cell 200 is illustrated in more detail on the right in FIG. 1. Together, these FET cells form a single FET.

Each FET cell 200 comprises a gate base Bg, one or more gate bond pads that are integrally formed or connected to gate base Bg, and one or more gate fingers g1, g2 extending from gate base Bg. The combined gate width of the one or more gate fingers g1, g2 in a given FET cell is referred to as the total FET cell gate width Uw. In FIG. 1, two gate fingers g1, g2 are used, each having a gate width Wg. The total FET cell gate width therefore equals 2Wg.

Each FET 200 cell further comprises a drain base Bd and one or more drain fingers d extending from drain base Bd. Each FET cell 200 also comprises one or more drain bond pads that are integrally formed or connected to drain base Bd, and one or more source contacts s1, s2. These latter contacts are typically grounded during operation. For example, GaN die 130 may be provided with vias that provide an electrical connection between the one more source contacts s1, s2 and the backside of GaN die 130. This latter backside is typically covered with a metal and is physically and electrically connected to heat conducting substrate 15. Furthermore, heat conducting substrate 15 is made of electrically conductive material. Power amplifier 100 is typically mounted on a printed circuit board (PCB) wherein heat conducting substrate 15 is connected to a ground patch, metal coin, or other ground terminal on the PCB.

A plurality of bondwires connects RF input leads 10A, 10B to the gate terminal of the FET. More in particular, second input bondwires 43 connect RF input leads 10A, 10B to a first terminal 41 of an input matching capacitor that is integrated on input semiconductor die 40, and first input bondwires 42 connect first terminal 41 of the input matching capacitor to the gate bond pads of the FET. The other terminal of the input matching capacitor is grounded.

Similarly, a plurality of output bondwires connects RF output leads 20A, 20B to the drain terminal of the FET. More in particular, first output bondwires 52 connect the drain bond pads of the FET to a first terminal 51 of an output matching capacitor that is integrated on output semiconductor die 50, and second output bondwires 53 connect first terminal 51 of the output matching capacitor to RF output leads 20A, 20B. The other terminal of the output matching capacitor is grounded.

Bondwires 42, 43 and the input matching capacitor jointly form an input impedance matching network. Similarly, bondwires 52, 53 and the output matching capacitor jointly form an output impedance matching network. In other embodiments, the input and/or output matching capacitor is omitted.

For each FET cell 200, a respective input capacitor and/or a respective output capacitor may be used. In this case, the non-grounded terminals of these capacitors may not be electrically connected to each other. In other embodiments, a single capacitor is used for the input and/or output capacitor. In this case, each FET cell is associated with a segment of said single capacitor, wherein the non-grounded terminals of the segments are integrally connected. Hereinafter, the respective capacitor or the segment of a single capacitor associated with a FET cell will be referred to as capacitive element. As described above, this capacitive element may be part of a plurality of capacitive elements of which the non-grounded terminals are connected, as shown in FIG. 1, or of which the non-grounded terminals are isolated from each other. Furthermore, a distinction will hereinafter be made between output capacitive elements formed on semiconductor die 50 or other substrate, and input capacitive elements formed on semiconductor die 40 or other substrate.

Although FIG. 1 illustrates a single input impedance matching stage and a single output matching stage, multiples of these stages may be used.

Input semiconductor die 40 and output semiconductor die 50 may each have a conducting substrate, or vias formed in an otherwise non-conducting substrate to allow the other terminal of the input or output capacitor to be electrically connected to heat conducting substrate 15, which is exposed on a backside of packaged power amplifier 100 and which also serves as a ground terminal of packaged power amplifier 100.

For each FET cell 200, the one or more drain bond pads are electrically connected to the first terminal of a respective output capacitive element among the plurality of output capacitive elements using one or more first output bondwires 52 among the plurality of first output bondwires 52. The one or more first output bondwires 52 at least partially form, for said FET cell, a first inductor between the drain base Bd of that FET cell and the first terminal 51 of the output capacitive element to which that FET cell is connected.

Typically, the operating frequency of the packaged amplifier 100 limits the gate width per gate finger that can be used. To obtain amplifiers delivering more output power, it is therefore necessary to increase the number of FET cells.

US2021167741A1 discloses an input matching circuit, at least one amplifying transistor that receives a signal from the input matching circuit, a first dummy transistor that receives a signal from the input matching circuit, a second dummy transistor that receives a signal from the input matching circuit, and an output matching circuit that outputs an output of the amplifying transistor. The amplifying transistor is arranged between the first dummy transistor and the second dummy transistor, the amplifying transistor, the first dummy transistor. Furthermore, the second dummy transistor is provided in a row along the input matching circuit.

U.S. Pat. No. 6,815,740B1 discloses a FET or bipolar junction transistor (BJT) structure or distributed transistor amplifier having a tapered gate feed line and a tapered channel width (tapered source fingers, tapered drain fingers) that provides increased bandwidth and gain in the microwave/mm-wave frequency spectrum.

SUMMARY

Applicant has found that in particular with GaN FETs, increasing the number of FET cells often will not result in the expected power scaling. For example, selecting twice the number of FET cells will not double output power. Instead, the obtained output power is less than doubled although the power consumption of the FET is doubled. Consequently, power efficiency of the FET will drop for larger FET devices.

It is an object of the present disclosure to provide a power amplifier in which the abovementioned scaling problem is addressed and which displays improved power added efficiency.

According to the present disclosure, this object is achieved using the power amplifier as defined in claim 1 that is characterized in that for FET cells arranged at opposing ends of the row of FET cells a total FET cell gate width and an inductance of the first inductor is larger and smaller than the total FET cell gate width and inductance of the first inductor for one or more FET cells arranged in the middle of the row of FET cells, respectively.

In conventional devices, power is not generated uniformly. More in particular, power is generated more in the center FET cells. To address this asymmetry while maintaining a same total gate width, gate width for the center FET cell(s) is reduced compared to outer FET cells. At the same time, to account for the change in output impedance as a result of changing the gate width of the FET cell(s), the inductance of the first inductor changes. More specifically, the inductance of the first inductor for the center FET cell(s) is higher than that of the first inductor for the outer FET cells.

The plurality of FET cells can be an even number of FET cells. In this case, the row of FET cells extends from a first outer FET cell to a first center FET cell, and from a second center FET cell to a second outer FET cell, wherein the first and second center FET cells are adjacently arranged and wherein the first outer FET cell and the second outer FET cell are arranged at opposite ends of the row of FET cells. The total FET cell gate width and the inductance of the first inductor then decreases and increases, respectively, from the first outer FET cell to the first center FET cell, and increases and decreases, respectively, from the second center FET cell to the second outer FET cell.

Alternatively, the plurality of FET cells can be an odd number of FET cells. In this case, the row of unit cells extends from a first outer FET cell to a center FET cell, and from the center FET cell to a second outer FET cell, wherein the first and second outer FET cells are arranged at opposite ends of the row of FET cells. The total FET cell gate width and the inductance of the first inductor decreases and increases, respectively from the first outer FET cell to the center FET cell and increases and decreases, respectively, from the center FET cell to the second outer FET cell.

In both odd and even configurations, the increase and decrease of the inductance of the first inductor and the increase and decrease of the total FET cell gate width can be monotonic.

During predefined operating conditions, each FET cell may see an output impedance at its intrinsic drain. The abovementioned increase or decrease in total FET cell gate width and the corresponding decrease or increase in inductance of the first inductor can be configured for minimizing a difference between the output impedances seen by the plurality of FET cells during these predefined operating conditions. For example, the predefined operating conditions can be conditions at which the output power of the power amplifier is saturated at a frequency within an operational bandwidth of the power amplifier. Furthermore, the output impedance can be a large-signal impedance or a small-signal impedance.

For the purpose of decreasing or increasing the total FET cell gate width, the number of gate fingers and/or the gate width of the gate finger(s) may differ among the FET cells.

Additionally or alternatively, the first inductor for each FET cell can be formed using one or more first output bondwires among a plurality of first output bondwires, wherein for the purpose of decreasing or increasing the inductance of the first inductor the number of first output bondwires, the height of the first output bondwire(s), and/or the length of the first output bondwire(s) may differ among the FET cells.

The FET cells may comprise a gate base and one or more gate fingers extending from the gate base, wherein the total FET cell gate width corresponds to the combined width of the one or more gate fingers. The FET cells may further comprise a drain base, one or more drain fingers extending from the drain base, and one or more drain bond pads that are integrally formed or connected to the drain base. The FET cells may also comprise one or more source contacts. In some embodiments, these latter contacts are grounded during operation by one or more vias in the GaN semiconductor die that connects the contacts to the backside of the GaN semiconductor die, which is typically covered by a backside metallization. In turn, the GaN semiconductor die can be mounted on a heat conducting substrate or other metal part that is grounded during use.

For each pair of adjacently arranged FET cells, the corresponding gate bases may be in physical and electrical contact and the corresponding drain bases may be in physical and electrical contact. In this manner, drain and gate bars are formed.

The power amplifier may further comprise a plurality of output capacitive elements, each having a first terminal and a grounded second terminal, and a plurality of second output bondwires. For each FET cell, the one or more drain bond pads can be electrically connected to the first terminal of a respective output capacitive element among the plurality of output capacitive elements using one or more first output bondwires among the plurality of first output bondwires, wherein the one or more first output bondwires at least partially form, for said FET cell, the first inductor that is arranged between the drain base of that FET cell and the first terminal of the output capacitive element to which that FET cell is connected. Moreover, the first terminals of the output capacitive elements can be connected directly or indirectly to the one or more RF output terminals using the plurality of second output bondwires. The first terminals of the output capacitive elements can be physically connected for forming a single terminal, wherein the output capacitive elements correspond to segments of a single capacitor. Alternatively, the capacitive elements are electrically isolated from each other.

The one or more output capacitive elements, the plurality of first output bondwires, and the plurality of second output bondwires may jointly form output impedance matching stages between the drain bases of the FET cells and the one or more output RF terminals.

For realizing the output capacitive elements, the power amplifier may comprise an output substrate, such as a semiconductor die, on which the output capacitive elements are integrated.

The power amplifier may comprise one or more RF input terminals. Furthermore, the FET cells can be connected to the one or more RF input terminals either directly or indirectly via a respective second inductor. For FET cells arranged at opposing ends of the row of FET cells, an inductance of the second inductor can be smaller, respectively, than the inductance of the second inductor for one or more FET cells arranged in the middle of the row of FET cells. For example, the second inductor for each FET cell can be formed using one or more first input bondwires among a plurality of first input bondwires, wherein for the purpose of decreasing or increasing the inductance of the second inductor the number of first input bondwires, the height of the first input bondwire(s), and/or the length of the first input bondwire(s) may differ among the FET cells.

Each FET cell may comprise one or more gate bond pads integrally formed or connected to the gate base. In addition, the power amplifier may further comprise a plurality of input capacitive elements, each having a first terminal and a grounded second terminal, and a plurality of second input bondwires. For each FET cell, the one or more gate bond pads can be electrically connected to the first terminal of a respective input capacitive element among the plurality of input capacitive elements using one or more first input bondwires among the plurality of first input bondwires. The one or more first input bondwires may at least partially form, for the FET cell, the second inductor that is arranged between the gate base of that FET cell and the first terminal of the input capacitive element to which that FET cell is connected. Moreover, the first terminals of the input capacitive elements can be connected directly or indirectly to the one or more RF input terminals using the plurality of second input bondwires.

Similarly to the output capacitive elements, the first terminals of the input capacitive elements can be physically connected for forming a single terminal, wherein the input capacitive elements may correspond to segments of a single capacitor.

The plurality of input capacitive elements, the plurality of first input bondwires, and the plurality of second input bondwires may jointly form one or more input impedance matching stages between the one or more RF input terminals and the gates bases of the FET cells.

The power amplifier may comprise an input substrate, such as a semiconductor die, on which the input capacitive elements can be integrated.

A ratio between the total gate width of a FET cell arranged in or near the middle of the row of FET cells and the total gate width of a FET cell arranged at an end of the row of FET cells may lie in between 0.5 and 0.9, and/or a ratio between the inductance of the first inductor of a FET cell arranged in or near the middle of the row of FET cells and the inductance of the first inductor of a FET cell arranged at an end of the row of FET cells may lie in between 1.1 and 2.

The power amplifier can be a packaged power amplifier, comprising a heat conducting substrate on which the GaN die and the input and output substrate, when applicable, are arranged. The heat conducting substrate may comprise a copper block or copper based block. The packaged power amplifier can be in the form of a flat no-leads package, such as a dual flat no-leads package (DFN) or quad flat no-leads package (QFN). Alternatively, the packaged power amplifier may comprise a leadframe package having a plurality of leads forming the one or more RF input terminals and/or the one or more RF output terminals.

According to a second aspect, the present disclosure provides a Doherty amplifier comprising a main amplifier and one or more peak amplifiers, wherein at least one of the main amplifier and the one or more peak amplifiers comprises the power amplifier as described above. When the main amplifier and the one or more peak amplifiers are packaged power amplifiers, the main amplifier and at least one among the one or more peak amplifiers can be arranged inside a same package.

BRIEF DESCRIPTION OF THE DRAWINGS

Next, example embodiments will be described in more detail referring to the appended drawings.

DETAILED DESCRIPTION

Figure 1:
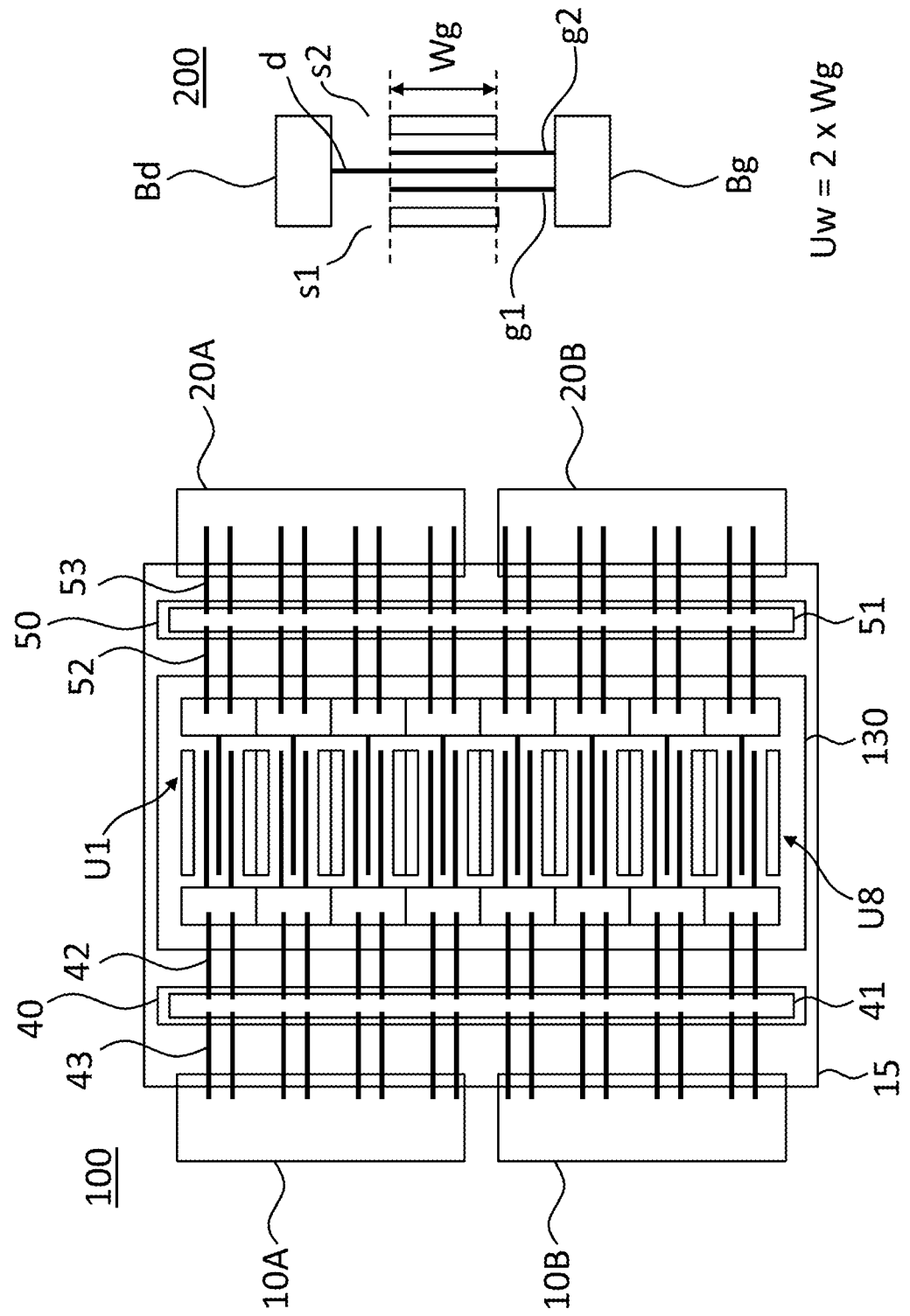
FIG. 1 illustrates a schematic layout of a GaN based power amplifier.
Figure 2:
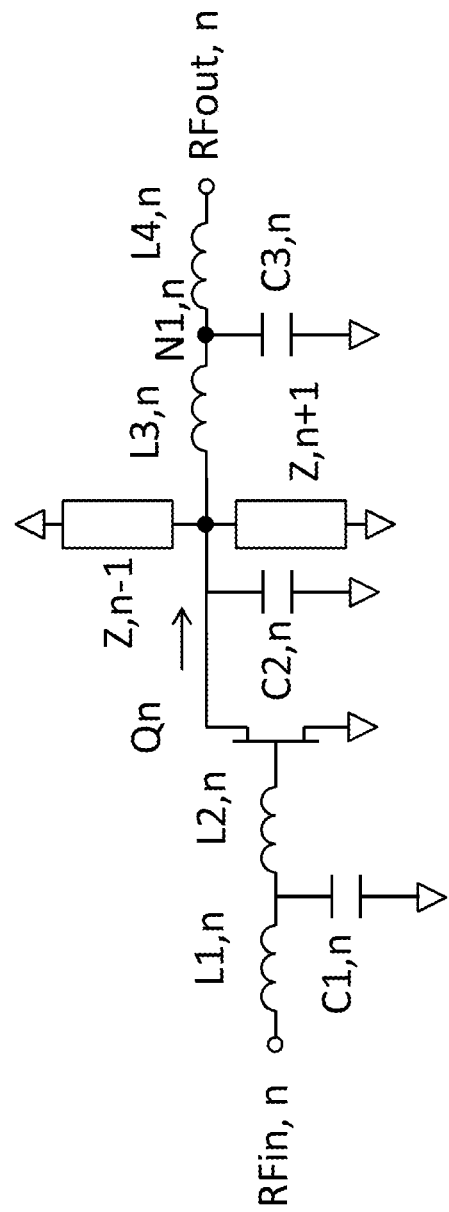
FIG. 2 illustrates an equivalent circuit of a segment of the power amplifier of FIG. 1.

FIG. 2 illustrates an equivalent circuit of a segment of the power amplifier of FIG. 1. In this figure, FET Qn is a representation of the nth FET cell of which the layout is depicted on the right hand side in FIG. 1. Furthermore, inductor $L1,n$ represents bondwires 43, and inductor $L2,n$ bondwires 42 that are connected to this FET cell. Similarly, capacitor $C1,n$ represents a segment of the capacitor realized on semiconductor die 40 that is associated with this FET cell. This nth FET cell has an output capacitance that is modeled by $C2,n$. $Z,n-1$ represents the impedance seen at the drain of the nth FET cell looking towards the (n−1)th cell and $Z,n+1$ represents the impedance seen at the drain of the nth FET cell looking towards the (n+1)th cell. $L3,n$ represents bondwires 52, and inductor $L4,n$ bondwires 53 that are connected to this FET cell. In addition, capacitor $C3,n$ represents a segment of the capacitor realized on semiconductor die 50 that is associated with this FET cell.

$L1,n$, $C1,n$, and $L2,n$ jointly form an input impedance matching network, and $L3,n$, $C3,n$, and $L4,n$ jointly form an output impedance matching network. Furthermore, $L3,n$ is referred to as the first inductor, and $L2,n$ as the second inductor.

The RF input of the nth FET cell, referred to as RFin,n in FIG. 2, is connected to other RF inputs on one of the RF input terminals 10A, 10B. Similarly, the RF output of the nth FET cell, referred to as RFout,n in FIG. 2, is connected to other RF outputs on one of the RF output terminals 20A, 20B.

Applicant had found that an important source of the unequal power distribution in the FET can be attributed to the different effects impedances $Z,n-1$ and $Z,n+1$ have on the impedance seen by the various FET cells. More in particular, at the ends of the row of FET cells, such impedance is only present in one direction. Put differently, in FIG. 1, $Z,0$ and $Z,9$ are infinite. Consequently, the impedance seen by FET cells in the center of the row is lower than that at the ends of the row.

According to the present disclosure, this imbalance is addressed by using cells at the ends of the row that have a larger total FET cell gate width and a smaller inductance of inductor $L3,n$ than FET cells that are arranged in the middle of the row of FET cells. An example of such a power amplifier is shown in FIG. 3.

Figure 3:
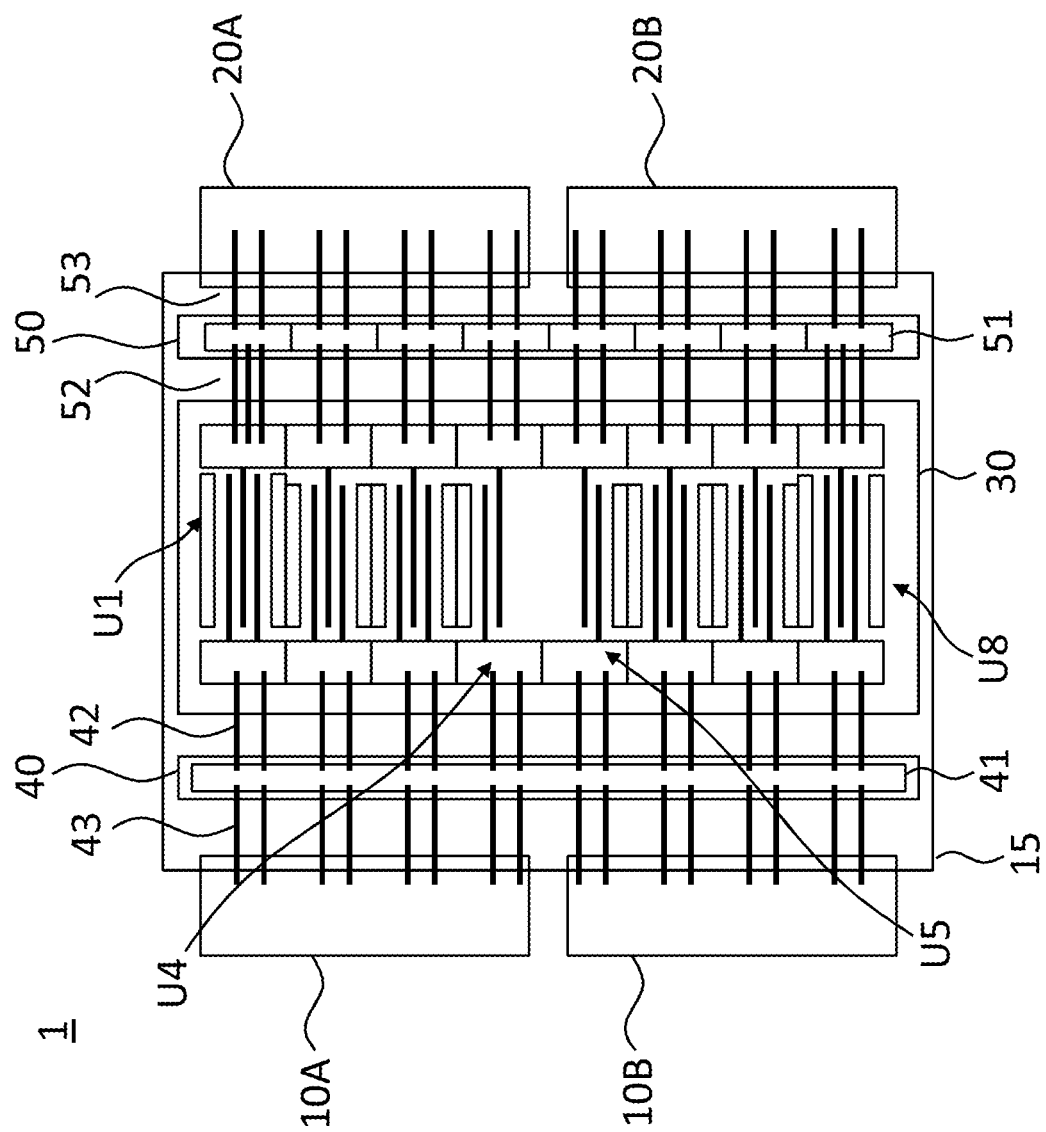
FIG. 3 illustrates an embodiment of a power amplifier, according to example embodiments.

In FIG. 3, an embodiment of a power amplifier 1 in accordance with the present disclosure is shown. Amplifier 1 comprises the same components as amplifier 100, and the various components of amplifier 1 are therefore denoted using the same reference signs.

Amplifier 1 differs from amplifier 100 shown in FIG. 1 in that FET cells U1, U8 have an increased total FET cell gate width compared to the other FET cells that is demonstrated by the wider gate fingers. In addition, FET cells U1, U8 have a reduced inductance that is associated with inductor $L3,n$ compared to the other FET cells. This reduction has been achieved by including an extra bondwire compared to FET cells U2, U3, U4, U5, U6, and U7.

On the other hand, FET cells U4, U5 have a reduced total FET cell gate width compared to the other FET cells that is demonstrated by those cells lacking one gate finger compared to the other FET cells. In addition, FET cells U4, U5 have an increased inductance that is associated with inductor $L3,n$ compared to the other FET cells. This reduction has been achieved by omitting one of two bondwires when compared to FET cells U2, U3, U6, and U7.

The inductance associated with $L3,n$ may increase monotonically going from an end of the row of FET cells to a center of the row of FET cells. For a power amplifier having an even number of FET cells, e.g. N cells, this means that $L3,n >= L3,n-1$ for $2<=n<=N/2$ and $L3,n >= L3,n+1$ for $(N-1)>=n>=(N/2+1)$. For a power amplifier having an odd number of FET cells, e.g. M cells, this means that $L3,n >= L3,n-1$ for $2<=n<=(M/2+0.5)$ and $L3,n >= L3,n+1$ for $(M-1)>=n>=(M/2+0.5)$.

Similarly, the total gate width of a FET cell, denoted by $Uw,n$, may decrease monotonically going from an end of the row of FET cells to a center of the row of FET cells. For a power amplifier having an even number of FET cells, e.g. N cells, this means that $Uw,n<=Uw,n-1$ for $2<=n<=N/2$ and $Uw,n<=Uw,n+1$ for $(N-1)>=n>(N/2+1)$. For a power amplifier having an even number of FET cells, e.g. M cells, this means that $Uw,n<=Uw,n-1$ for $2<=n<=(M/2+0.5)$ and $Uw,n<=Uw,n+1$ for $(M-1)>=n>=(M/2+0.5)$.

As show in FIG. 3, the inductance associated with $L3,n$ is identical for all FET cells except for FET cells U4, U5. In some embodiments, for increasing manufacturability, the same bondwire shape and length for bondwires 52 may be used. In those cases, inductance can only be changed by changing the number of bondwires.

In other embodiments, a more gradual increase in inductance is used. In these embodiments, the number of bondwires, the bondwire shape, length, and/or height are varied between adjacent FET cells.

Similar considerations hold for changing the total FET gate width. In FIG. 3, the total FET cell gate width has been increased by changing the gate width of a single finger, whereas a reduction in total FET cell gate width has achieved by omitting a gate finger relative to the other FET cells. Various combinations are possible within the scope of the present disclosure. More in particular, a change in total FET cell gate width can be obtained by changing the number and/or width of the gate fingers of a FET cell.

Notwithstanding the abovementioned aspect of manufacturability, the inductance value associated with $L3,n$ may be changed in accordance with the change in total FET cell gate width. More specifically, for increased total FET cell gate widths, a reduced inductance may be used. In some embodiments, similar modifications can be used for inductance $L2,n$. In even further embodiments, not only $L3,n$, but also $C3,n$, and/or $L4,n$ can be adapted to accommodate for the different total FET cell gate width. In general, the adaptations should be such that a difference in the output impedances seen by the different FET cells is lowered. The same approach could be followed for $L1,n$, but also $C1,n$, and/or $L2,n$. In this case, the adaptations should be such that a difference in the input impedances of the different FET cells is lowered.

In addition, in FIG. 3 a single capacitor is used both at the input and output. More in particular, the non-grounded terminals of capacitors $C3,n$ and $C1,n$ are electrically connected as these terminals correspond to segments of a larger conductive terminal of the capacitor formed on semiconductor dies 40, 50. In other embodiments, the non-grounded terminals may be disconnected from each other, leaving only a common ground connected of the grounded terminals. In such case, capacitors $C3,n$ and $C1,n$ act as separate capacitors.

A GaN based amplifier having a total gate width of 25.2 mm having a standard design was compared to a GaN based amplifier having a design in accordance with the present disclosure in which the same total gate width was used but in which the total gate width for the center FET cells was reduced whereas it was increased for the outer FET cells. In addition, in this latter design, one bondwire was omitted for the center FET cells only. This comparison demonstrated that for the new design, the saturated power was increased from 52.9 dBm to 53.5 dBm, and the maximum power added efficiency was increased from 65.1 to 72 percent.

Figure 4:
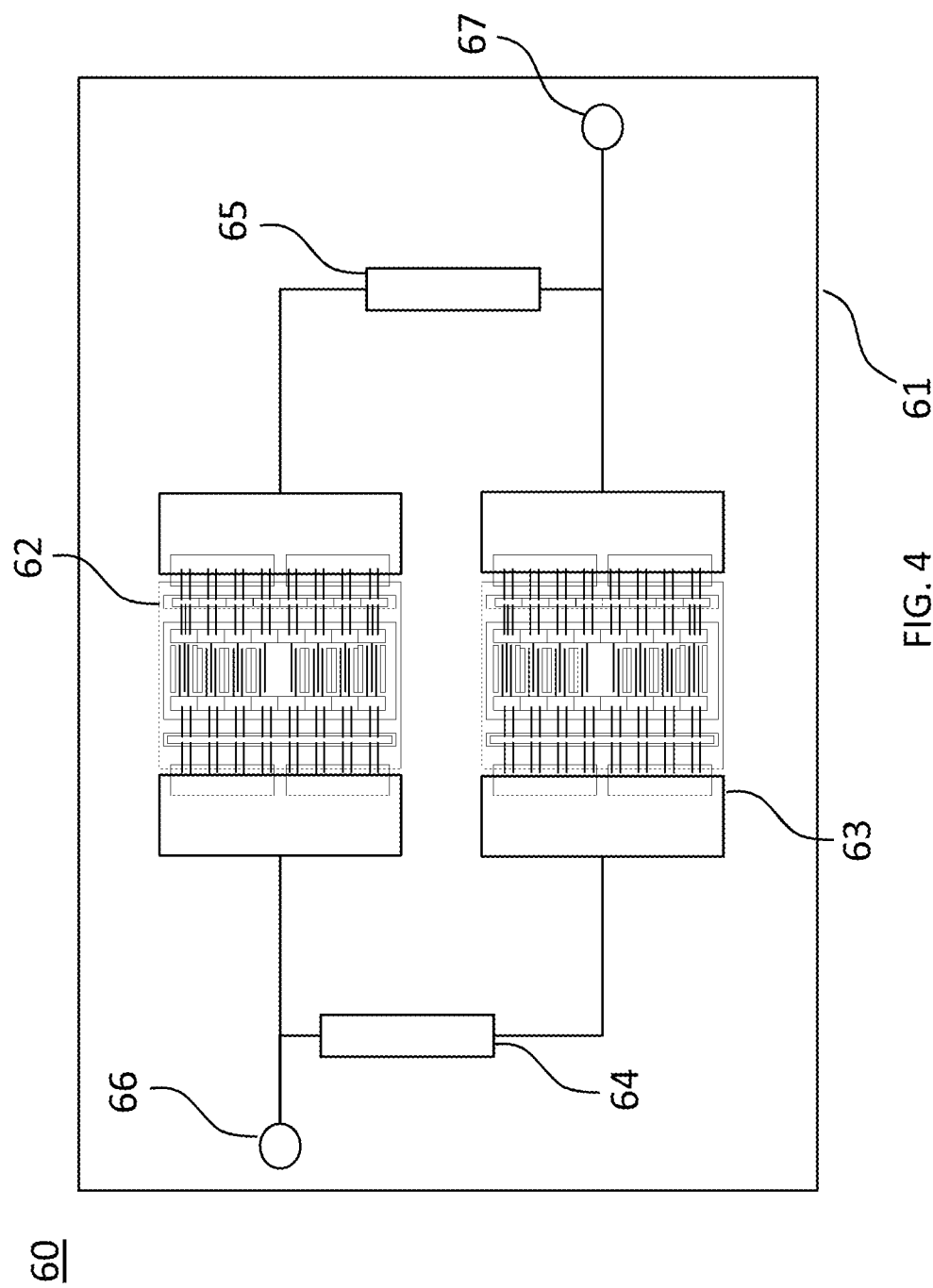
FIG. 4 illustrates an embodiment of a Doherty amplifier, according to example embodiments.

FIG. 4 illustrates an embodiment of a Doherty amplifier 60 in accordance with the present disclosure. Doherty amplifier 60 comprises a main amplifier 62 and a peak amplifier 63 that are both mounted on a printed circuit board 61. More in particular, main amplifier 62 and peak amplifier 63 each comprise a packaged power amplifier similar to packaged power amplifier 1 shown in FIG. 3.

Doherty amplifier 60 has an RF input 66 and an RF output 67. An RF signal entering RF input 66 will be split in two parts, one part for main amplifier 62 and one part for peak amplifier 63. This latter part is delayed by 90 degrees at the operational frequency by phase delay unit 64.

The signals amplified by main amplifier 62 and peak amplifier 63 are outputted at RF output 67. However, the signal outputted by main amplifier 62 is fed through an impedance inverter 65, which is typically formed using a 90 degrees transmission line or an electrical equivalent thereof. In this manner, a desired load modulation of the impedance seen by main amplifier 62 is obtained whereas at the same time, signals are added in-phase at RF output 67.

The Doherty configuration shown in FIG. 4 may be referred to as a regular Doherty configuration. However, different Doherty configurations are also possible, such as a parallel Doherty configuration, and an inverted Doherty configuration. The present disclosure is equally applicably to those configurations.

In addition, FIG. 4 shown an amplifier having two discrete packages. However, embodiments are equally possible in which the main and peak amplifier are packaged in a same leadframe based package or other package.

Finally, FIG. 4 shows a single main amplifier and a single peak amplifier. However, the present disclosure is equally applicable to multi-stage Doherty amplifiers in which two or more peak amplifiers are used.

In the above, the present disclosure has been explained using detailed embodiments thereof. However, the present disclosure is not limited to these embodiments. Rather, various modifications are possible without deviating from the scope of the present disclosure, which is defined by the appended claims and their equivalents. For example, the present disclosure could be equally applied to other semiconductor technologies, such as silicon (Si), gallium arsenide (GaAs), or indium phosphide (InP). In addition, transistor types other than FETs, such as bipolar transistors, could equally benefit from the concept of the present disclosure.

What is claimed is:

1. A power amplifier comprising:
   one or more radiofrequency (RF) output terminals; and
   a Gallium Nitride (GaN) semiconductor die on which a power field-effect transistor (FET) is integrated, said FET comprising a plurality of FET cells that are adjacently arranged in a row,
   wherein each of the FET cells is connected to a respective first inductor,
   wherein each of the respective first inductors is connected either directly or indirectly to one of the one or more RF output terminals,
   wherein a total FET cell gate width of a FET cell arranged at an end of the row of FET cells is larger than the total FET cell gate width for a FET cell arranged in or near the middle of the row of FET cells, and
   wherein an inductance of the first inductor of the FET cell arranged at the end of the row of FET cells is smaller than the inductance of the first inductor of the FET cell arranged in or near the middle of the row of FET cells.

2. The power amplifier according to claim 1, wherein said plurality of FET cells is an even number of FET cells, wherein the row of FET cells extends from a first outer FET cell to a first center FET cell and from a second center FET cell to a second outer FET cell, wherein the first and second center FET cells are adjacently arranged, wherein the first outer FET cell and the second outer FET cell are arranged at opposite ends of the row of FET cells,
   wherein the total FET cell gate width and the inductance of the first inductor decreases and increases, respectively, from the first outer FET cell to the first center FET cell and increases and decreases, respectively, from the second center FET cell to the second outer FET cell, and
   wherein said increase and decrease of the inductance of the first inductor and said increase and decrease of the total FET cell gate width are monotonic.

3. The power amplifier according to claim 1, wherein said plurality of FET cells is an odd number of FET cells, wherein the row of unit cells extends from a first outer FET cell to a center FET cell and from the center FET cell to a second outer FET cell, wherein the first and second outer FET cells are arranged at opposite ends of the row of FET cells,
   wherein the total FET cell gate width and the inductance of the first inductor decreases and increases, respectively from the first outer FET cell to the center FET cell and increases and decreases, respectively, from the center FET cell to the second outer FET cell, and
   wherein said increase and decrease of the inductance of the first inductor and said increase and decrease of the total FET cell gate width are monotonic.

4. The power amplifier according to claim 3, wherein during predefined operating conditions, each FET cell sees an output impedance at its intrinsic drain, wherein said increase or decrease in total FET cell gate width and said corresponding decrease or increase in inductance of the first inductor are configured for minimizing a difference between the output impedances seen by the plurality of FET cells during said predefined operating conditions, and wherein the output impedance is a large-signal impedance or a small-signal impedance.

5. The power amplifier according to claim 4, wherein the predefined operating conditions are conditions at which the output power of the power amplifier is saturated at a frequency within an operational bandwidth of the power amplifier.

6. The power amplifier according to claim 1, wherein, for the purpose of decreasing or increasing the total FET cell gate width, the number of gate fingers or the gate width of the gate finger(s) differs among the FET cells.

7. The power amplifier according to claim 1, wherein the first inductor for each FET cell is formed using one or more first output bondwires among a plurality of first output bondwires, wherein, for the purpose of decreasing or increasing the inductance of the first inductor, and wherein the number of first output bondwires, the height of the first output bondwire(s), or the length of the first output bondwire(s) differs among the FET cells.

8. The power amplifier according to claim 1, wherein the FET cells comprise:
   a gate base and one or more gate fingers extending from the gate base, wherein the total FET cell gate width corresponds to the combined width of the one or more gate fingers;
   a drain base and one or more drain fingers extending from the drain base;
   one or more drain bond pads integrally formed or connected to the drain base; and
   one or more source contacts,
   wherein for each pair of adjacently arranged FET cells, the corresponding gate bases are in physical and electrical contact and the corresponding drain bases are in physical and electrical contact.

9. The power amplifier according to claim 8, wherein the first inductor for each FET cell is formed using one or more first output bondwires among a plurality of first output bondwires, wherein, for the purpose of decreasing or increasing the inductance of the first inductor, the number of first output bondwires, the height of the first output bondwire(s), or the length of the first output bondwire(s) differs among the FET cells, and wherein the power amplifier further comprises:
   a plurality of output capacitive elements, each having a first terminal and a grounded second terminal; and
   a plurality of second output bondwires, wherein, for each FET cell, the one or more drain bond pads are electrically connected to the first terminal of a respective output capacitive element among the plurality of output capacitive elements using one or more first output bondwires among the plurality of first output bondwires, said one or more first output bondwires at least partially forming, for said FET cell, the first inductor arranged between the drain base of that FET cell and the first terminal of the output capacitive element to which that FET cell is connected, wherein each of the first terminals of the output capacitive elements is connected to a respective second bondwire of the plurality of second output bondwires, and wherein each of the plurality of second output bondwires is connected either directly or indirectly to one of the one or more RF output terminals.

10. The power amplifier according to claim 9, wherein the first terminals of the output capacitive elements are physically connected for forming a single terminal, and wherein the output capacitive elements correspond to segments of a single capacitor, the power amplifier comprising an output substrate on which the output capacitive elements are integrated.

11. The power amplifier according to claim 9, wherein said one or more output capacitive elements, said plurality of first output bondwires, and said plurality of second output bondwires jointly form output impedance matching stages between the drain bases of the FET cells and the one or more RF output terminals.

12. The power amplifier according to claim 1, further comprising one or more RF input terminals,
wherein each of the FET cells is connected to a respective second inductor,
wherein each of the respective second inductors is connected either directly or indirectly to one of the one or more RF input terminals, and
wherein an inductance of the second inductor of the FET cell arranged at the end of the row of FET cells is smaller than the inductance of the second inductor of the FET cell arranged in or near the middle of the row of FET cells.

13. The power amplifier according to claim 12, wherein the second inductor for each FET cell is formed using one or more first input bondwires among a plurality of first input bondwires, and wherein, for the purpose of decreasing or increasing the inductance of the second inductor, the number of first output bondwires, the height of the first output bondwire(s), or the length of the first output bondwire(s) differs among the FET cells.

14. The power amplifier according to claim 13, wherein the FET cells comprise:
a gate base and one or more gate fingers extending from the gate base, wherein the total FET cell gate width corresponds to the combined width of the one or more gate fingers;
a drain base and one or more drain fingers extending from the drain base;
one or more drain bond pads integrally formed or connected to the drain base; and
one or more source contacts,
wherein each FET cell comprises one or more gate bond pads integrally formed or connected to the gate base, the power amplifier further comprising:

a plurality of input capacitive elements, each having a first terminal and a grounded second terminal; and
a plurality of second input bondwires,
wherein for each FET cell the one or more gate bond pads are electrically connected to the first terminal of a respective input capacitive element among the plurality of input capacitive elements using one or more first input bondwires among the plurality of first input bondwires, said one or more first input bondwires at least partially forming, for said FET cell, the second inductor arranged between the gate base of that FET cell and the first terminal of the input capacitive element to which that FET cell is connected,
wherein each of the first terminals of the input capacitive elements is connected to a respective second input bondwire,
wherein each of the respective bondwires is connected either directly or indirectly to one of the one or more RF input terminals,
wherein the first terminals of the input capacitive elements are physically connected for forming a single terminal, and
wherein the input capacitive elements correspond to segments of a single capacitor.

15. The power amplifier according to claim 14, wherein the plurality of input capacitive elements, said plurality of first input bondwires, and said plurality of second input bondwires jointly form one or more input impedance matching stages between the one or more RF input terminals and the gates bases of the FET cells.

16. The power amplifier according to claim 14, further comprising an input substrate on which the input capacitive elements are integrated.

17. The power amplifier according to claim 1, wherein a ratio between the total gate width of a FET cell arranged in or near the middle of the row of FET cells and the total gate width of a FET cell arranged at an end of the row of FET cells is between 0.5 and 0.9, and wherein a ratio between the inductance of the first inductor of a FET cell arranged in or near the middle of the row of FET cells and the inductance of the first inductor of a FET cell arranged at an end of the row of FET cells is between 1.1 and 2.

18. The power amplifier according to claim 12, wherein the power amplifier is a packaged power amplifier comprising:
a heat conducting substrate on which the GaN semiconductor die is arranged; and
a leadframe package having a plurality of leads forming the one or more RF input terminals or the one or more RF output terminals.

19. A Doherty amplifier comprising a main amplifier and one or more peak amplifiers, wherein at least one of the main amplifier and the one or more peak amplifiers comprises the power amplifier according to claim 1.

20. The Doherty amplifier according to claim 19, wherein the power amplifier is a packaged power amplifier comprising a heat conducting substrate on which the GaN semiconductor die is arranged, and wherein the main amplifier and at least one of the one or more peak amplifiers is arranged inside a same package.

* * * * *